(12) United States Patent
Deboer et al.

(10) Patent No.: US 6,426,306 B1
(45) Date of Patent: *Jul. 30, 2002

(54) BARRIER LAYER FABRICATION METHODS

(75) Inventors: Scott J. Deboer, Boise, ID (US); Randhir P. S. Thakur, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/713,845

(22) Filed: Nov. 15, 2000

Related U.S. Application Data

(63) Continuation of application No. 09/004,932, filed on Jan. 9, 1998, now Pat. No. 6,180,481.

(51) Int. Cl.⁷ .................... H01L 21/31; H01L 21/469
(52) U.S. Cl. ........................ 438/762; 438/396
(58) Field of Search ................ 438/396, 381, 438/239, 240, 768, 785, 762

(56) References Cited

U.S. PATENT DOCUMENTS

| | | | |
|---|---|---|---|
| 5,005,102 A | * 4/1991 | Larson | 361/313 |
| 5,142,438 A | 8/1992 | Reinberg et al. | 361/313 |
| 5,336,638 A | 8/1994 | Suzuki et al. | 437/190 |
| 5,352,623 A | 10/1994 | Kamiyama et al. | 437/52 |
| 5,444,006 A | 8/1995 | Han et al. | 437/60 |
| 5,763,300 A | 6/1998 | Park et al. | 438/240 |
| 5,837,593 A | 11/1998 | Park et al. | 438/396 |
| 5,998,236 A | * 12/1999 | Roeder et al. | 438/104 |
| 6,048,737 A | * 4/2000 | Chung et al. | 438/3 |
| 6,180,481 B1 | * 1/2001 | Deboer et al. | 438/396 |

OTHER PUBLICATIONS

"Surface Oxidation Behavior of TiN Film Caused By Depositing SrTiO3 Film", Yoshio Abe, Midori Kawamura, Hideto Yanagisawa and Katsutaka, Jpn. J. Appl. Phys., vol. 34, (1995), Pt. 2, No. 12B, pp 1678–1681.*

* cited by examiner

Primary Examiner—Michael J. Sherry
Assistant Examiner—Scott B. Geyer

(57) ABSTRACT

A process for forming a storage capacitor for a semiconductor assembly, by forming a first storage electrode having a top surface consisting of titanium nitride; forming a barrier layer directly on the titanium nitride, the barrier layer (a material containing any one of amorphous silicon, tantalum, titanium, or strontium) being of sufficient thickness to substantially limit the oxidation of the titanium nitride when the semiconductor assembly is subjected to an oxidizing agent (either an oxidizing agent or an nitridizing agent); converting a portion of the barrier layer to a dielectric compound; depositing a storage cell dielectric directly on the dielectric compound, the storage cell dielectric being of the same chemical makeup as the dielectric compound and thereby using the dielectric compound as a nucleation surface; and forming a second capacitor electrode on the storage cell dielectric.

21 Claims, 3 Drawing Sheets

BARRIER LAYER FABRICATION METHODS

This application is a continuation to U.S. patent application Ser. No. 09/004,932, filed Jan. 9, 1998 now U.S. Pat. No. 6,180,481.

FIELD OF THE INVENTION

This invention relates to semiconductor fabrication processing and more particularly to a method for fabricating oxygen diffusion barrier layers to enhance the electrical characteristics of a storage capacitor for a Dynamic Random Access Memory (DRAM).

BACKGROUND OF THE INVENTION

The continuing trend of scaling down integrated circuits has forced the semiconductor industry to consider new techniques for fabricating precise components at sub-micron levels. With the industry moving towards processes for fabrication of smaller device geometries, isolation between devices becomes a very critical issue.

Fabrication processes for fabrication of DRAMs having smaller device geometries are of particular interest as each new generation of DRAMs push technology, including equipment limitations, to new areas of research. A major area of research has been in the development of the DRAM storage cell capacitor. Each DRAM generation requires a device that is more dense than the preceding generation and yet industry and competition demand that the physical size of the device remain comparable in size to the preceding generation. To accomplish this requirement, much of the DRAM research is focused on building a smaller storage capacitor and yet maintain adequate capacitance, as the storage capacitor requires a good portion of the DRAM dice.

One method of increasing capacitance without increasing the storage electrode size is by providing a storage cell dielectric that possesses high quality dielectric characteristics, such as a high dielectric constant, etc. The quality of a cell dielectric is also somewhat dependent on the type of material used to build the capacitor electrodes due mainly in part to the work function potential of the material. (The work function potential of a material is the potential of a barrier which must be overcome to remove an electron from the fermi-level to the vacuum level outside the material.) Electrodes made from titanium nitride (TiN) are desirable for use in DRAM capacitor due to the large barrier height (which will deter current conduction resulting from the work function potential of the TiN) that develops at the TiN/cell dielectric interface. This will potentially lead to leakage reduction in a dielectric dominated by electrode-limited conduction properties. The dielectric leakage current mechanism is dominated by the material properties of the capacitor electrodes rather than the dielectric itself, as the leakage current attributed to the characteristics of a dielectric is minimal when compared to the leakage current attributed to the material make-up of the capacitor electrodes themselves.

However, TiN electrodes are prone to an oxidation of the top 70 to 430 Å when exposed to an oxygen atmosphere at elevated temperatures. This oxidation of the TiN surface leads to poor nucleation of the cell dielectric which results in an increase in possible leakage current through the dielectric and a reduction in the reliability of the capacitor. This reduction in electrical quality has been shown to exist in both silicon nitride and tantalum oxide ($Ta_2O_5$) dielectrics deposited on TiN electrodes. For example, $Si_3N_4$ forms an excellent interface when it is deposited directly on bare silicon, but forms a poor interface when deposited on refractory metal nitrides, such as TiN, or on refractory metals themselves.

Typically, for a capacitor utilizing a $Ta_2O_5$ storage cell dielectric, the $Ta_2O_5$ is deposited on a lower capacitor electrode made up of a silicon nitride layer, formed by rapid thermal processing (RTP), which in turn is formed on top of polysilicon. This configuration creates a polysilicon/nitride/$Ta_2O_5$ interface. If the top capacitor electrode is TiN, a top $Ta_2O_5$/TiN interface is formed. This particular capacitor structure, consisting of a polysilicon/nitride/$Ta_2O_5$ interface, creates a lower barrier to leakage current then does the barrier created by the $Ta_2O_5$/TiN interface. Therefore the polysilicon/nitride/$Ta_2O_5$ interface allows a larger leakage current from the capacitor during a positive bias then does the $Ta_2O_5$/TiN interface. Due to this lower barrier height at the polysilicon/nitride/$Ta_2O_5$ interface the polysilicon/nitride/$Ta_2O_5$ interface now becomes the limiting factor in determining the performance of the capacitor.

Implementations of the present invention teach methods to efficiently use conductive materials, such as silicon, noble metals, refractory metals, refractory metal nitrides and in particular TiN, as the lower capacitor electrode and to avoid the above limitation (resulting from conventional processes). In the case of using TiN as the capacitor bottom electrode, conventional processes deposit a cell dielectric directly on the TiN electrode. However, these methods do not effectively limit the oxidation of the TiN prior to cell dielectric deposition. An embodiment of the present invention provides a reliable method to effectively use the conductive materials listed above as capacitor bottom electrode while providing a dielectric nucleation surface for a subsequent deposition of cell dielectric.

SUMMARY OF THE INVENTION

Exemplary implementations of the present invention disclose methods for chemically bonding a dielectric material to a conductive material in a semiconductor fabrication process. The process converts at least a portion of a conductive layer that has been formed directly on the conductive material to a dielectric compound, thereby forming a dielectric nucleation surface. After the nucleation surface is formed a dielectric film containing chemical elements that make the conductive layer is deposited directly on the dielectric nucleation surface. The converted portion of the conductive layer becomes a barrier layer to oxygen diffusion when the structure is subjected to a subsequent oxygen ambient. The process flirter provides suitable methods to fabricate capacitors that utilize conductive materials, such as, silicon, refractory metals, refractory metal nitrides, and noble metals, as the bottom electrode.

DETAILED DESCRIPTION OF THE INVENTION

Several exemplary implementations of the present invention are directed to a process for forming a capacitor cell dielectric as depicted in the embodiments of FIGS. 1A–1C, FIGS. 2A–2C, and FIGS. 3A–3C.

Figure 1A:
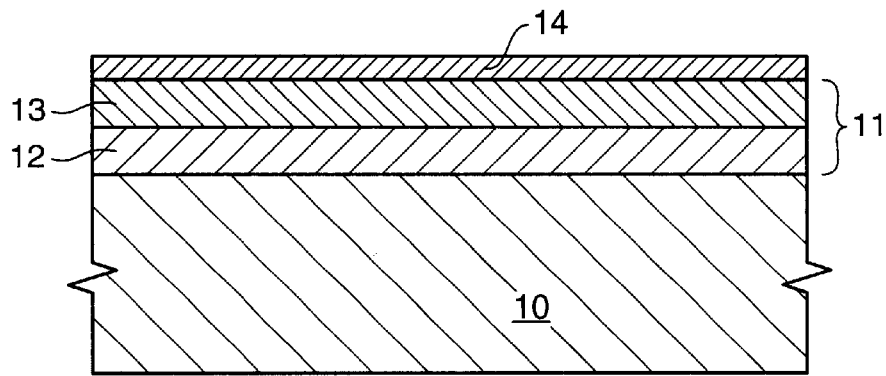
FIG. 1A is a cross-sectional view depicting a capacitor storage electrode on a semiconductor substrate where the electrode consists of a titanium nitride surface on top of which is a layer of tantalum.

In a first exemplary implementation of the present invention and referring now to FIG. 1A, a cross-sectional view depicts a capacitor storage electrode 11 formed on semiconductor substrate 10. In this case semiconductor substrate 10 is making reference to a material which supports the construction of the capacitor electrode 11. Capacitor electrode 11 consists of a polysilicon portion 12 on top of which is formed a titanium nitride (TiN) layer so that capacitor electrode 11 has a titanium nitride surface 13. Although polysilicon is shown and is a preferred material used to construct the lower portion of capacitor electroce 11 other materials may be used that are suitable for accepting a layer of TiN as the surface layer. After the TiN is formed, a conductive tantalum barrier layer 14 is formed directly on the TiN layer 13. It is desired that the thickness of tantalum layer 14 be optimized so that it minimizes or even eliminates oxidation of underlying TiN layer 13 during subsequent exposure to oxygen, such as an oxidation anneal step or the dielectric deposition step.

Figure 1B:
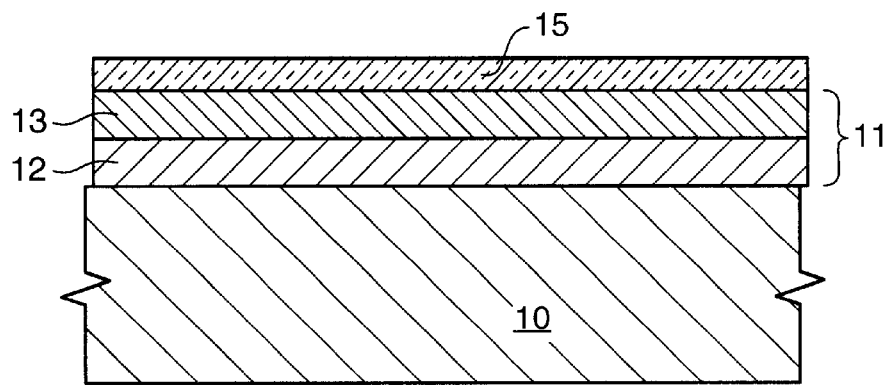
FIG. 1B is a cross-sectional view continuing with process steps shown in FIG. 1A, depicting the tantalum layer being converted to tantalum oxide during an oxygen anneal.

Referring now to FIG. 1B, a portion of tantalum barrier layer 14 is converted to tantalum oxide 15 during an oxygen anneal. The conversion of tantalum to tantalum oxide may either be performed by an oxygen anneal while the assembly is in a deposition chamber during a subsequent tantalum oxide deposition step or by a separate rapid thermal oxidation step prior to tantalum oxide deposition. It is desired that the TiN surface be oxidized no more than a maximum of 50 Å and it is further preferred that essentially none (0%) of the TiN surface be oxidized. Regardless of the method used to oxidize the tantalum, major advantages of the present invention are gained. One advantage is, during formation the tantalum will make a strong chemical bond to the underlying TiN. Another advantage is, during oxidation only a portion of the tantalum becomes oxidized while protecting the TiN from becoming oxidized. The oxidation of the tantalum maintains a strong chemical bond to the TiN and also just as advantageous, provides a tantalum oxide nucleation surface for a subsequent tantalum oxide deposition step.

Figure 1C:
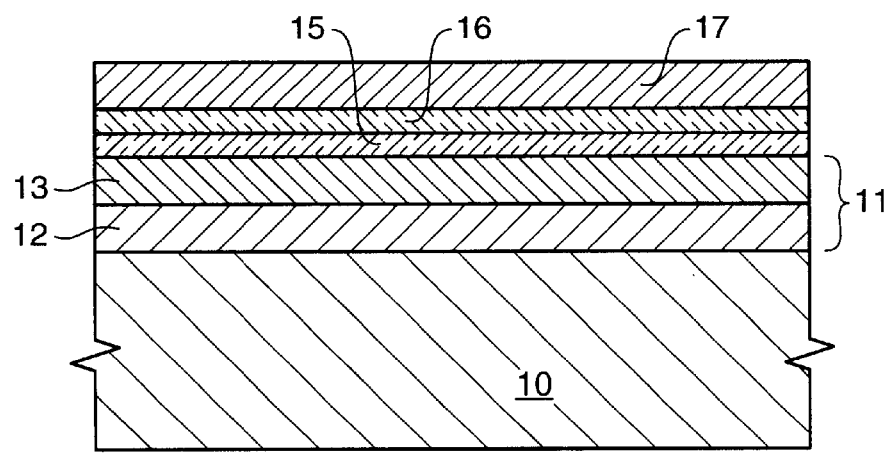
FIG. 1C is a cross-sectional view continuing with process steps shown in FIG. 1B, depicting the deposition of a tantalum oxide cell dielectric followed by the formation of a top titanium nitride electrode.

Referring now to FIG. 1C, tantalum oxide cell dielectric 16 is deposited on tantalum oxide nucleation surface 15. Nucleation surface 15 may be created by various methods. Am efficient method is to use the chemical reactions that occur during deposition of the tantalum oxide itself. During deposition, the chamber contains oxygen atoms that will initially oxidize the tantalum surface and thus create nucleation surface 15. As deposition of the tantalum oxide continues less and less of tantalum barrier layer will become oxidized. Another method would be to deliberately oxidize tantalum barrier layer 14 prior to tantalum oxide deposition and thereby create nucleation surface 15. In either case, it is important that only a portion of tantalum barrier layer 14 be converted to tantalum oxide so that the remaining portion of the non-converted (non-oxidized) tantalum barrier layer 14 is sufficient in thickness so that a subsequent oxygen anneal will only oxidize the remaining non-converted portion of barrier layer 14 and thus prevent or substantially restrict the oxidation of underlying TiN layer 13. Regardless of which method is used to create nucleation surface 15, the presence of tantalum barrier layer 14 causes the formation of a nucleation surface that is chemically the same as the deposited cell dielectric (in other words in this example, both the barrier layer and the cell dielectric contain tantalum elements).

The deposited tantalum oxide 16 forms a strong chemical bond to the tantalum oxide nucleation surface 15 and thereby creates a high quality cell dielectric film which has been shown to reduce charge leakage to acceptable levels for DRAM operation depending on the tantalum oxide film thickness (less than $10-7$ $A/cm^2$ at 1 volt for maximum capacitance). Finally the capacitor is completed by the formation of a top electrode 17. It is preferred that electrode 17 be titanium nitride or tungsten nitride, however other materials used by those skilled in the art to form the top capacitor electrode may be used.

Figure 2A:
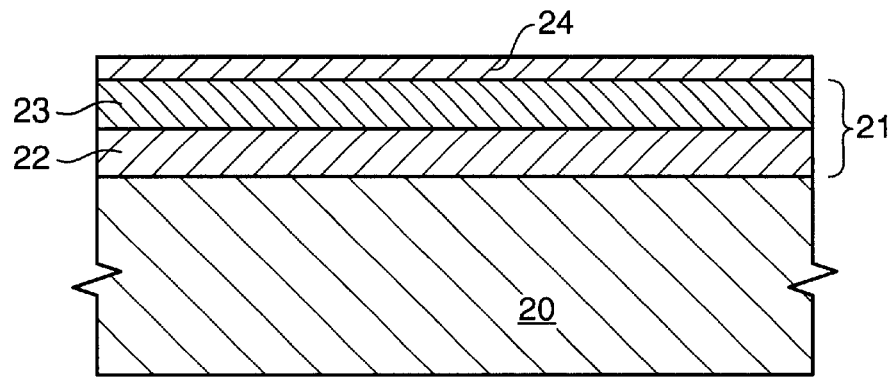
FIG. 2A is a cross-sectional view depicting a capacitor storage electrode on a semiconductor substrate where the electrode consists of a titanium nitride surface on top of which is a layer of amorphous silicon.

In a second exemplary implementation of the present invention and referring now to FIG. 2A, a cross-sectional view depicts a capacitor storage electrode 21 on semiconductor substrate 20. In this case semiconductor substrate 20 is making reference to a material which supports the construction of the capacitor electrode 21. Capacitor electrode 21 consists of a polysilicon portion 22 on top of which is formed TiN so that capacitor electrode 21 has a TiN surface 23. Although polysilicon is shown and is a preferred material used to construct the lower portion of capacitor electrode 21, other materials may be used that are suitable for accepting a layer of TiN as the surface layer. After the TiN is formed, a conductive layer 24 of amorphous silicon is formed directly on TiN layer 23 at a preferred thickness no greater than 50 Å. The thickness of the amorphous silicon layer is critical as it must be thin enough to be entirely consumed during a subsequent nitrogen anneal to form silicon nitride and yet thick enough to protect the underlying TiN layer 23 from becoming oxidized during a following anneal step. The thin silicon layer can be deposited at temperatures below 525° C. where the temperature is at a low enough point where TiN is unlikely to oxidize.

Figure 2B:
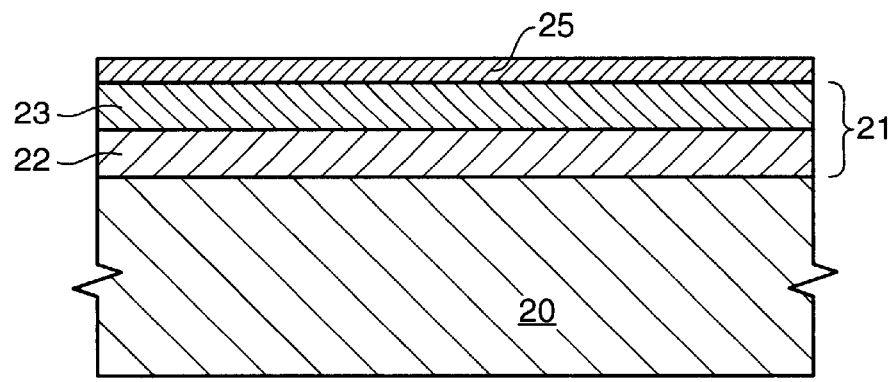
FIG. 2B is a cross-sectional view continuing with process steps shown in FIG. 2A, depicting the amorphous silicon layer being converted to silicon nitride during an nitrogen anneal.

Referring now to FIG. 2B, amorphous silicon layer 24 is converted to silicon nitride 25 during an nitrogen anneal. The conversion of amorphous silicon to silicon nitride may be performed by a separate rapid thermal nitridation (RTN) step or the amorphous silicon layer 24 may be converted to silicon nitride during a silicon nitride deposition step. If conversion of the layer 24 is relied on during silicon nitride deposition, nitrogen atoms from a source gas supplied to the deposition chamber, such as $NH_3$, will initially start to combine with the amorphous silicon to form silicon nitride. If this method alone is used to nitridize the amorphous silicon, the deposition step must continue long enough to completely convert the amorphous silicon to silicon nitride and thus avoid formation of a resistive interface between the TiN and amorphous silicon. It is preferred however, that the amorphous silicon is subjected to an RTN step to insure complete nitridation of the amorphous silicon.

Among the advantages of the present invention, the amorphous silicon, will initially make a strong chemical bond to the underlying TiN during the formation of the amorphous silicon. As another advantage, during the nitridation of the amorphous silicon, the amorphous silicon is converted to silicon nitride which will protect the TiN from becoming oxidized upon exposure to oxygen, such as to air or during the reoxidation process which typically follows nitride deposition. The nitridation of the amorphous silicon maintains a strong chemical bond to the TiN and also advantageously, provides an silicon nitride nucleation surface for a subsequent silicon nitride deposition.

Figure 2C:
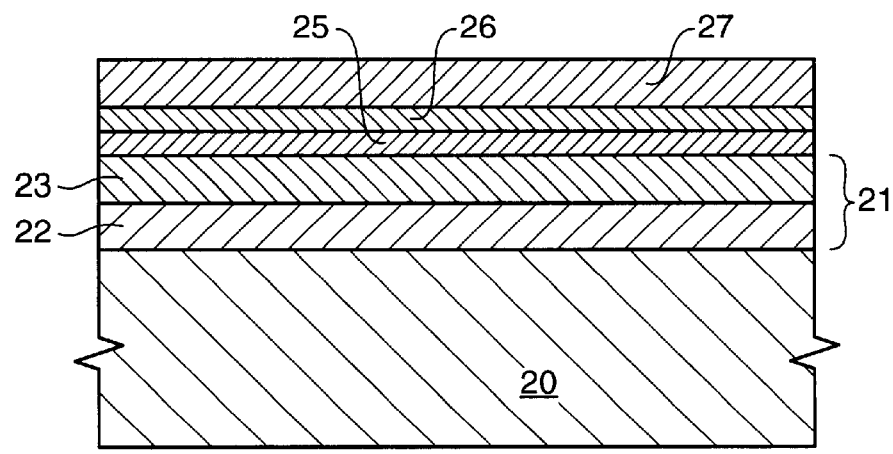
FIG. 2C is a cross-sectional view continuing with process steps shown in FIG. 2B, depicting the deposition of a silicon nitride cell dielectric followed by the formation of a top titanium nitride electrode.

Referring now to FIG. 2C, silicon nitride cell dielectric 26 is deposited on silicon nitride nucleation surface 25. As mentioned above, a nucleation surface 25 is created that is chemically the same as the deposited cell dielectric. Thus, the deposited silicon nitride forms a strong chemical bond to the silicon nitride nucleation surface and thereby creates a high quality cell dielectric film which has been shown to reduce charge leakage to result in capacitors with excellent reliability and electrical performances. Finally the capacitor is completed by the formation of a top electrode 27. It is preferred that electrode 27 be TiN, however other materials used by those skilled in the art to form the top capacitor electrode may be used.

A third exemplary implementation of the present invention is similar to the first example except high dielectric constant materials are used for the cell dielectric. In that regard and referring now to FIG. 3A, a cross-sectional view depicts a capacitor storage electrode 31 on semiconductor substrate 30. As before, semiconductor substrate 30 is making reference to a material which supports the construction of the capacitor electrode 31. Capacitor electrode 31 consists of a polysilicon portion 32 on top of which is formed of TiN so that capacitor electrode 31 has a TiN surface 33. Although polysilicon is shown and is a preferred material used to construct the lower portion of capacitor electrode 31, other materials may be used that are suitable for accepting a layer of TiN as the surface layer. After the TiN is formed, a conductive layer 34, being any one of strontium, titanium or a strontium/titanium compound, is formed directly on the TiN layer 33. Layer 34 may be formed by sputtering or chemical vapor deposition to a preferred thickness of less than 50 Å. As in the first embodiment, the thickness of layer 34 is critical as it must be thick enough to protect the underlying TiN layer 33 from becoming oxidized during any subsequent exposure to oxygen.

Figure 3A:
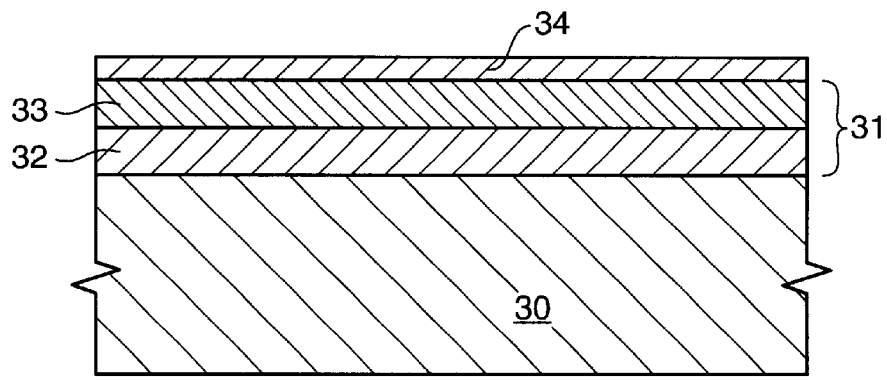
FIG. 3A is a cross-sectional view depicting a capacitor storage electrode on a semiconductor substrate where the electrode consists of a titanium nitride surface on top of which is a layer of a strontium/titanium compound.
Figure 3B:
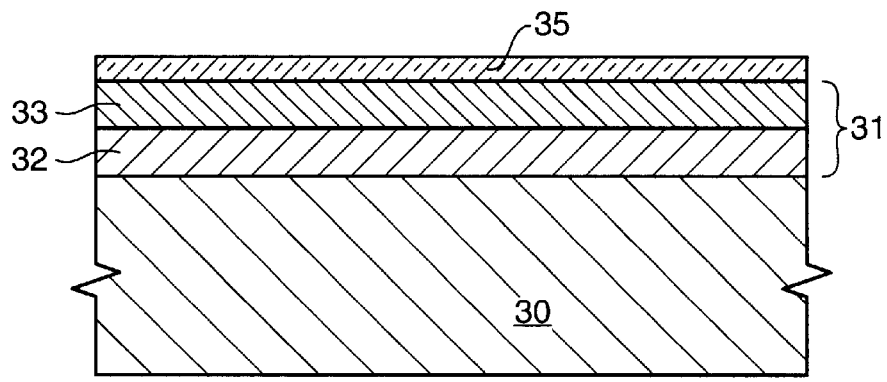
FIG. 3B is a cross-sectional view continuing with process steps shown in FIG. 3A, depicting the strontium/titanium layer being converted to an oxide (STO) during an oxygen anneal.

Referring now to FIG. 3B, conductive layer 34 is converted to oxide 35 during an oxygen anneal. As discussed in the first example, the conversion of the conductive layer to an oxide may either be performed by an oxygen anneal while in a deposition chamber which will occur during a subsequent oxide deposition step or by a separate rapid thermal oxidation step prior to the oxide deposition. Regardless of the method used to oxidize the conductive layer (again, any one of strontium or a strontium/titanium compound), major advantages of the present invention are gained. For example, using strontium/titanium, the strontium/titanium, will initially make a strong chemical bond to the underlying TiN during the formation. The oxidation of the strontium/titanium layer maintains a strong chemical bond to the TiN and also advantageously provides a strontium titanate (STO) nucleation surface for a subsequent deposition of a high dielectric constant material, while protecting a majority if not 100% of the TiN from becoming oxidized.

Figure 3C:
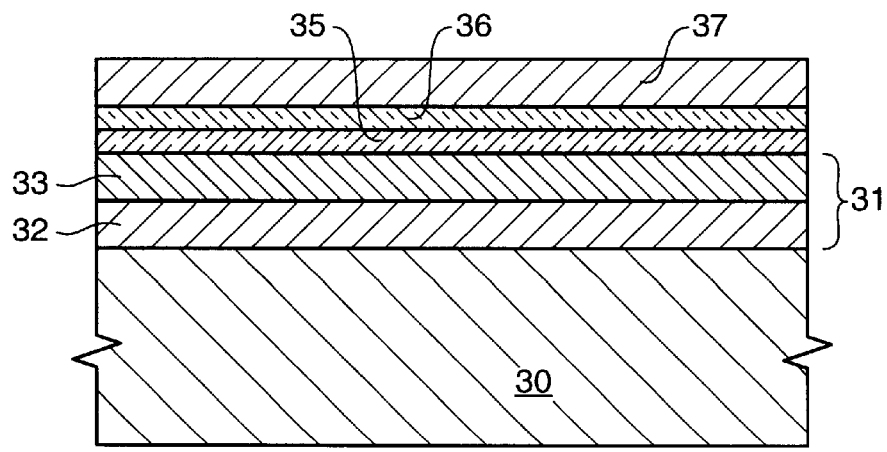
FIG. 3C is a cross-sectional view continuing with process steps shown in FIG. 3B, depicting the deposition of a high dielectric constant cell dielectric followed by the formation of a top titanium nitride electrode.

Referring now to FIG. 3C, a high dielectric constant material to serve as cell dielectric 36, is deposited on strontium oxide nucleation surface 35. In this particular implementation, barium strontium titanate (BST) or strontium titanate (STO) are ideal selections due to the presence of a chemically similar nucleation surface, mainly strontium titanate. As mentioned above, the previous oxidation of the strontium/titanium creates a nucleation surface that is chemically the same as the cell dielectric that is deposited. Thus the deposited high dielectric material forms a strong chemical bond to the strontium titanate nucleation surface and thereby creates a high quality cell dielectric film which has been shown to reduce charge leakage and thus results in capacitors with excellent reliability and electrical performance. Finally the capacitor is completed by the formation of a top electrode 37. It is preferred that electrode 37 be titanium nitride, however other materials used by those skilled in the art to form the top capacitor electrode may be used.

In the above exemplary implementation, the same idea may be applied if other high dielectric constant materials, such as, lead lanthanum titanate (PLT), lead lanthanum zirconium titanate (PLZT), etc., are selected. An important aspect of the present invention is to provide a nucleation surface for a subsequent dielectric deposition so that the nucleation surface and the subsequently deposited dielectric possess common chemical elements.

Ideally, for all of the exemplary implementations of the present invention it is preferred that a maximum TiN surface oxidation of 50 Å results and it is further preferred none of the TiN surface becomes oxidized. It is also preferred that the overall cell dielectric thickness (which includes the oxidation or nitridation of the barrier layer plus the deposited dielectric) be no greater than 100 Å, with the ideal thickness being around 75 Å. However, for high dielectric constant materials, such as BST or STO, a desired overall thickness will be less than 500 Å. Taking the desired overall cell dielectric thickness into account, a barrier layer being no greater than approximately 50 Å will provide adequate protection for the underlying TiN as well as result in the desired overall cell dielectric thickness. Though 50 Å has been shown to be sufficient, process parameter variations will dictate the optimum barrier layer thickness used and thus the present invention is not limited to the above film thickness limitations. but rather provides a method to use a barrier film of optimal thickness.

The present invention has been described in several exemplary implementations wide reference to a bottom capacitor electrode having a TiN surface. Though it is preferred that the capacitor have a TiN surface, it is not intended to limit the scope of the present invention. For example, the method taught herein is also applicable to silicon as well as all refractory metal and refractory metal nitrides (i.e., tungsten, tungsten nitride, tantalum and tantalum nitride). Furthermore, the method of the present invention is also applicable to a capacitor electrode that has a noble metal surface and in particular platinum or ruthenium. In the case of a noble metal, though the noble metal itself is immune to oxidation, the presence of a barrier layer will prevent oxygen atoms from diffusing through the noble metal and oxidizing an underlying layer, such as silicon.

It is to be understood that although the present invention has been described with reference to several preferred embodiments, various modifications, known to those skilled in the art,. may be made to the structures and process steps presented herein without departing from the invention as recited in the several claims appended hereto.

What is claimed is:

1. A method for bonding a dielectric material to a conductive material in a semiconductor fabrication process comprising:

forming a conductive layer directly on said conductive material;

converting a portion of said conductive layer to a dielectric compound having a dielectric nucleation surface;

after said step of converting, depositing a dielectric film directly on said dielectric nucleation surface, said dielectric film, said dielectric nucleation surface and said dielectric compound containing common chemical elements.

2. The method of claim 1, wherein said conductive material consists of a refractory metal.

3. The method of claim 1, wherein said conductive material consists of a refractory metal nitride.

4. The method of claim 1, wherein said conductive material consists of a noble metal.

5. A method for preparing a conductive material in a semiconductor assembly to receive a dielectric comprising:

forming a conductive layer on said conductive material;

converting a portion of said conductive layer to a dielectric compound having a dielectric nucleation surface, said dielectric nucleation surface and said dielectric compound containing common chemical elements.

6. The method of claim 5, wherein said conductive material consists of a refractory metal.

7. The method of claim 5, wherein said conductive material consists of a refractory metal nitride.

8. The method of claim 5, wherein said conductive material consists of a noble metal.

9. A method for preparing titanium nitride to receive a dielectric material comprising:

forming a conductive layer directly on said titanium nitride;

converting a portion of said conductive layer to a dielectric compound having a dielectric nucleation surface, said dielectric nucleation surface and said dielectric compound containing common chemical elements.

10. A method for limiting oxygen diffusion to a conductive film in a semiconductor fabrication process comprising:

forming a conductive layer directly on said conductive film;

converting a portion of said conductive layer to a dielectric material having a dielectric nucleation surface;

after said step of converting, depositing a dielectric film directly on said dielectric nucleation surface of said dielectric compound, said dielectric film, said dielectric nucleation surface and said dielectric compound containing common chemical elements.

11. The method of claim 10, wherein said conductive material consists of a noble metal.

12. The method of claim 10, wherein said conductive material consists of a refractory metal.

13. The method of claim 10, wherein said conductive material consists of a refractory metal nitride.

14. A method for limiting oxidation of titanium nitride in a semiconductor fabrication process comprising:

forming a conductive layer directly on said titanium nitride;

converting a portion of said conductive layer to a dielectric material having a dielectric nucleation surface;

after said step of converting, depositing a dielectric film directly on said dielectric nucleation surface of said dielectric compound, said dielectric film, said dielectric nucleation surface and said dielectric compound containing common chemical elements.

15. The method of claim 14, wherein said converting a portion of said conductive layer to a dielectric occurs during said depositing a dielectric film.

16. The method of claim 14, wherein said converting a portion of said conductive layer to a dielectric further comprises annealing said conductive layer in the presence of a dielectric forming agent prior to said depositing a dielectric film.

17. A process for forming a capacitor for a semiconductor assembly comprising:

forming a barrier layer directly on a conductive capacitor electrode, said barrier layer being of sufficient thickness to substantially limit diffusion of oxygen atoms therethrough while in the presence an oxidizing agent;

converting a portion of said barrier layer to a dielectric compound having a dielectric nucleation surface;

after said step of converting, depositing a storage cell dielectric directly on said dielectric nucleation surface of said dielectric compound, said storage cell dielectric, said dielectric nucleation surface and said dielectric compound being of substantially the same chemical makeup.

18. A process for preparing a capacitor conductive electrode to receive a dielectric during semiconductor processing comprising:

forming a barrier layer directly on said capacitor conductive electrode;

converting a portion of said barrier layer to a dielectric compound having a dielectric nucleation surface, said dielectric nucleation surface and said dielectric compound containing common chemical elements.

19. The process of claim 18, wherein said capacitor conductive electrode consists of titanium nitride.

20. The process of claim 18, wherein said barrier layer comprises a material containing any one of amorphous silicon, tantalum, titanium, or strontium.

21. The process of claim 18, wherein said barrier layer is no greater than 50 Å in thickness.

* * * * *

UNITED STATES PATENT AND TRADEMARK OFFICE
CERTIFICATE OF CORRECTION

PATENT NO. : 6,426,306 B1
DATED : July 30, 2002
INVENTOR(S) : Deboer et al.

It is certified that error appears in the above-identified patent and that said Letters Patent is hereby corrected as shown below:

Column 2,
Line 48, replace "flirter" with -- further --

Column 4,
Line 4, replace "Am" with -- An --

Signed and Sealed this

Twenty-eighth Day of January, 2003

JAMES E. ROGAN
*Director of the United States Patent and Trademark Office*